United States Patent
Liberini

(10) Patent No.: US 11,209,463 B2
(45) Date of Patent: Dec. 28, 2021

(54) PROBE CARD FOR A TESTING APPARATUS OF ELECTRONIC DEVICES

(71) Applicant: Technoprobe S.p.A., Cernusco Lombardone (IT)

(72) Inventor: Riccardo Liberini, Cernusco Lombardone (IT)

(73) Assignee: Technoprobe S.p.A., Cernusco Lombardone (IT)

( * ) Notice: Subject to any disclaimer, the term of this patent is extended or adjusted under 35 U.S.C. 154(b) by 83 days.

(21) Appl. No.: 16/664,669

(22) Filed: Oct. 25, 2019

(65) Prior Publication Data

US 2020/0057095 A1     Feb. 20, 2020

Related U.S. Application Data

(63) Continuation-in-part of application No. PCT/EP2018/060672, filed on Apr. 26, 2018.

(30) Foreign Application Priority Data

Apr. 28, 2017    (IT) .................. 102017000046645

(51) Int. Cl.
    *G01R 1/073*      (2006.01)

(52) U.S. Cl.
    CPC ...... *G01R 1/07378* (2013.01); *G01R 1/07342* (2013.01)

(58) Field of Classification Search
    CPC .................. G01R 1/07378; G01R 1/07342
    See application file for complete search history.

(56) References Cited

U.S. PATENT DOCUMENTS

| | | | |
|---|---|---|---|
| 2005/0156611 A1* | 7/2005 | Shinde | G01R 1/07378 324/756.03 |
| 2005/0277323 A1 | 12/2005 | Eldridge et al. | |
| 2007/0290705 A1 | 12/2007 | Eldridge et al. | |
| 2008/0048698 A1 | 2/2008 | Amemiya et al. | |
| 2008/0297184 A1 | 12/2008 | Miura et al. | |
| 2009/0219043 A1 | 9/2009 | Nakayama et al. | |
| 2010/0237889 A1 | 9/2010 | Desta et al. | |

(Continued)

FOREIGN PATENT DOCUMENTS

| KR | 10-2008-0085322 A | 9/2008 |
|---|---|---|
| KR | 20080085322 A * | 9/2008 |

*Primary Examiner* — Paresh Patel
(74) *Attorney, Agent, or Firm* — Seed Intellectual Property Law Group LLP

(57) ABSTRACT

A probe card for a testing apparatus of electronic devices comprises a probe head housing a plurality of contact probes, each contact probe having at least one contact tip adapted to abut onto contact pads of a device under test, as well as a main support and an intermediate support connected to the main support and adapted to realize a spatial transformation of distances between contact pads on its opposite faces as a space transformer, the probe card suitably also comprising at least one connecting element adapted to link the space transformer and the main support, this connecting element having a substantially rod-like body and being equipped with a first end portion comprising at least one terminal section adapted to be engaged in a corresponding housing realized in the space transformer and with a second terminal portion adapted to abut onto an abutment element linked to the main support.

26 Claims, 6 Drawing Sheets

(56) References Cited

U.S. PATENT DOCUMENTS

| | | |
|---|---|---|
| 2011/0156740 A1 | 6/2011 | Hwang et al. |
| 2012/0038383 A1 | 2/2012 | Wu et al. |
| 2014/0176181 A1* | 6/2014 | Choi ................... G01R 31/26 324/762.01 |
| 2015/0033553 A1 | 2/2015 | Wu et al. |
| 2015/0048856 A1* | 2/2015 | Vettori ............... G01R 1/06733 324/750.22 |
| 2016/0377655 A1* | 12/2016 | Liberini ............. G01R 1/07314 324/756.03 |

* cited by examiner

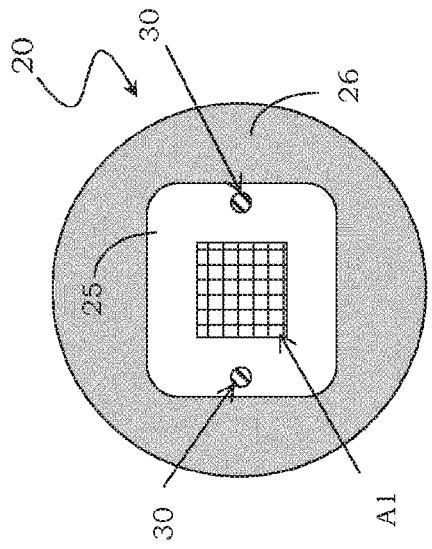
FIG. 3B
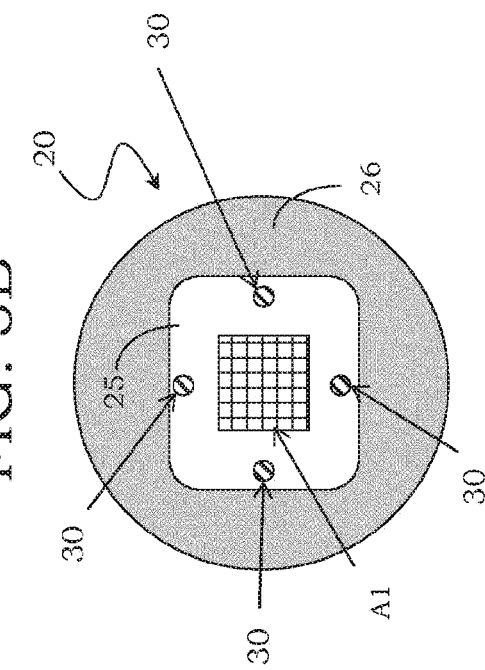
FIG. 3D
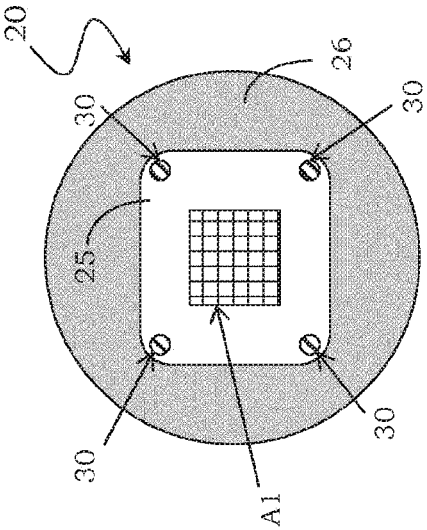
FIG. 3A
FIG. 3C
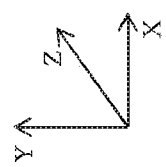

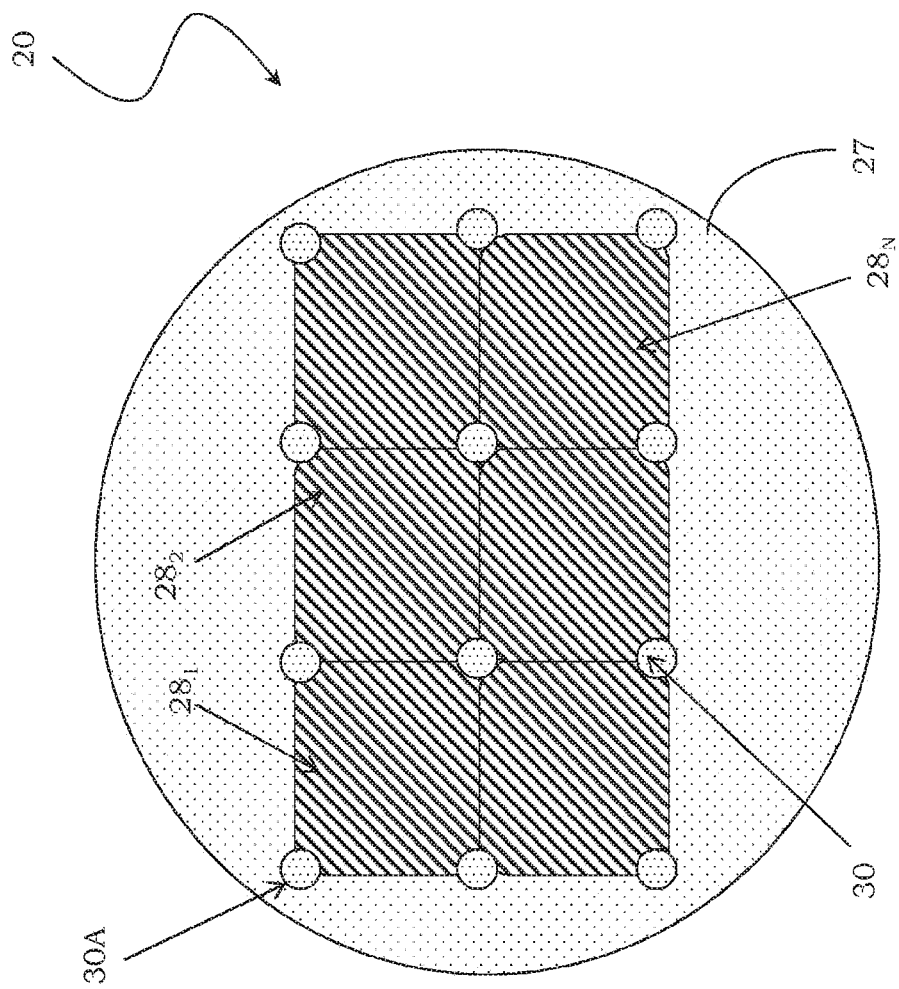
FIG. 5
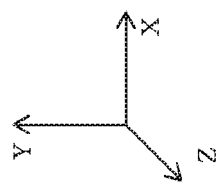

PROBE CARD FOR A TESTING APPARATUS OF ELECTRONIC DEVICES

BACKGROUND

Technical Field

The present disclosure relates to a probe card for a testing apparatus of electronic devices.

The disclosure relates, particularly but not exclusively, to a probe card comprising at least one intermediate support linked to a main support or main PCB, in particular intended to connect with a testing apparatus, this intermediate support being in particular able to realize a spatial transformation of distances between contact pads on its opposite faces, as a space transformer, and the following disclosure is made with reference to this field of application with the sole aim of simplifying the presentation thereof.

Description of the Related Art

As it is well known, a measure card, also known as probe card, is a device adapted to electrically connect a plurality of pads or contact pads of a microstructure, in particular an electronic device that is integrated on a wafer, with corresponding channels of a testing apparatus that performs the functionality testing thereof, in particular the electric testing, or the test, generically.

The test, which is performed on integrated devices, is particularly useful for detecting and isolating defective devices as early as in the production phase. Normally the probe cards are therefore employed for the electric test of devices that are integrated on wafers or chips before cutting or singulation and before assembling them inside a containment package.

A probe card comprises a probe head, including in turn a plurality of movable contact elements or contact probes equipped with at least one portion or contact tip adapted to abut onto a corresponding plurality of contact pads of the device under test. The terms "end" or "tip" indicate, here and in the following, an end portion, which is not necessarily pointed.

It is well known that the effectiveness and reliability of a measurement test precisely depends, among the other factors, on the realization of a good electric connection between device and testing apparatus, and therefore, on establishing an optimal probe/pad electric contact.

Among the types of probe heads used in the technical field considered here for testing devices that are integrated on wafers, the so-called probe heads with cantilever probes, also called cantilever probe heads, which precisely have probes protruding like a fishing rod above a device under test, are widely used.

In particular, a cantilever probe head of the known type usually supports a plurality of flexible, generally thread-like probes of pre-established electric and mechanical properties. The probes, cantilever protruding from the cantilever probe head, are substantially hook-shaped, due to the presence of a substantially elbow-folded terminal portion having a generally obtuse inner angle.

Good connection between the probes of a cantilever probe head and the contact pads of a device under test is ensured by the pressure of the probe head on the device itself, the contact probes undergoing, during this pressing contact, a vertical bending (with respect to the plane defined by the device under test) in the direction opposite the movement of the device towards the probe head.

The hook shape of the probes is such that, during the contact with the contact pads of the device under test and the travel of the probes upwards beyond a pre-established contact point, commonly called "overtravel", the contact tips of the probes slide on the contact pads by a length commonly called "scrub".

Probe heads commonly called probe heads with vertical probes and indicated with the English term "vertical probe heads" are also known in the field. A vertical probe head comprises a plurality of contact probes held by at least one pair of supports or guides, which are substantially plate-shaped and parallel to each other. These guides are arranged at a certain distance from each other in order to leave a free space or air gap for the movement and possible deformation of the contact probes and are equipped with suitable guide holes adapted to house these contact probes. The pair of guides comprises in particular an upper die and a lower die, both provided with guide holes within which the contact probes axially slide, which are usually formed by wires of special alloys with good electric and mechanical properties, the term "lower" conventionally indicating the closest guide to the device under test.

Good connection between the contact probes of the probe head and the contact pads of the device under test is ensured, in this case as well, by the pressure of the probe head on the device itself, the contact probes, which are movable within the guide holes made in the upper and lower guides, undergoing, during this pressing contact, a bending inside the air gap between the two guides and a sliding inside these guide holes.

Furthermore, the bending of the contact probes in the air gap can be helped by means of a suitable configuration of the probes themselves or of their guides, in particular by using pre-deformed contact probes or by suitably transversally moving away the guides comprising them.

In general, probe heads having not fixedly fastened blocked probes, but held interfaced to an opposite main support or main board, which is connected in turn to the testing apparatus, are used: such probe heads are referred to as not blocked testing heads. This main support is also indicated as main PCB, since it is usually made through the printed circuit or PCB (acronym from English: "Printed Circuit Board") techniques, a technology that allows making supports having active areas, even of large dimensions, though with great limitations with respect to a minimum value that can be reached for the pitch between the contact pads and thus usually precisely reserved to the main support, which has more relaxed distance constraints with respect to the device under test thanks to the use of an intermediate support or space transformer.

In this case, the contact probes have a further end or contact head adapted to abut onto a plurality of contact pads of this space transformer. Good electric connection between probes and space transformer is ensured analogously to the contact with the device under test by means of the pressure of the probes on the contact pads of the space transformer.

Furthermore, the main support is generally kept in position by a stiffener. The assembly of probe head, main support or main board, intermediate support or space transformer and stiffener forms a probe card, wholly and schematically indicated in FIG. 1 with 10.

In particular, the probe card 10 comprises a probe head 1, in the example of the figure a vertical probe head 2, adapted to abut onto contact pads of a device under test 3. In this case, such a probe head 1 in turn comprises at least one upper guide 4 and a support or lower guide 5, having corresponding upper and lower guide holes, within which the contact probes 2 slide.

Each contact probe 2 has in particular at least one end or contact tip abutting onto a contact pad of the device under test 3, thus performing the mechanical and electric contact between this device and a testing apparatus (not shown), which this probe head 1 forms a terminal element of.

Furthermore, each contact probe 2 has a further contact tip, indicated in the practice as contact head, towards a plurality of contact pads of an intermediate support, adapted to realize a spatial transformation, in particular in connection with the distances between the centers of the contact pads on its opposite faces and for this reason usually indicated as space transformer 6, connected to a main support or main board 7, which is connected in turn to the real testing apparatus. Good electric contact between contact probes and space transformer is ensured analogously to the contact with the device under test by means of the pressure of the probes onto the contact pads of the space transformer 6.

As already indicated, the main board 7 is kept in position by a stiffener 8.

In the vertical probe technology, it is therefore important to also ensure the good connection of the contact probes with the testing apparatus, in particular in correspondence with their contact heads and therefore with the space transformer.

Several technologies are known for producing this space transformer having generally very small thicknesses, of the order of 0.5-3 mm and therefore having planarity problems.

In particular, a first known solution is the ceramic-based or MLC (acronym from "MultiLayer Ceramic") technology, which allows making a plurality of layers of rigid ceramic material with a high planarity degree, these layers being interspersed with conductive layers connecting contact pads realized on opposite faces of the space transformer itself.

More particularly, the space transformer comprises a first plurality of pads arranged on a first face thereof facing towards the contact head; the pads of this first plurality have a distance between the corresponding centers, the so-called pitch, with analogous values to that of the device under test. The space transformer further comprises a second plurality of pads arranged on a second face thereof that is opposite the first face and in particular facing towards the main support or main board and therefore the testing apparatus; the pads of this second plurality have pitch values greater than the first plurality, this enlargement of the pitch being obtained thanks to the conductive paths realized by the conductive layers and by the non-conductive layers, in particular ceramic, suitably overlapped and interspersed. The pads of the first and second pluralities are commonly indicated as the probe-side or fine pitch pads and of the PCB-side or large pitch pads, respectively.

Alternatively, instead of an MLC ceramic multilayer, the use of an organic multilayer (MLO, acronym from "Multi-Layer Organic") associated with a rigid support, for instance glued thereto, it is also known, this MLO including a plurality of layers of organic material which realize a plurality of non-conductive layers, one or more conductive layers being arranged on these layers, analogously to what has been previously described. Such rigid support is preferably a ceramic one.

The mutual positioning of the elements that realize the probe card turns out to be an extremely important parameter for a correct working of the probe itself and the different technologies used to realize these elements cause planarity problems that complicate the configuration of the probe, especially in connection with the mutual positioning of space transformer and main support. The presence of the stiffener, which makes the whole assembly more rigid and resistant, also does not allow sufficiently eliminating the planarity defects of the space transformer and ensuring its correct and complete contact with the main board.

Probe card comprising connecting elements in the form of screws or bolt are known from US Patent Publication No. US 2015/033553, No. US 2012/038383, No. US 2005/277323, No. US 2007/290705, No. US 2008/048698 and No. US 2011/156740, European Patent Publication No. EP 1 959 260 and Korean Patent Publication No. KR 2008 0085322.

The mutual positioning of the elements that realize the probe card turns out to be further complicated by the working temperature of the card itself, in particular in case of tests performed at extreme temperature. In fact, in this case the thermal expansions of the elements that make up the probe card can affect their correct behaviour, due to the different thermal expansion coefficients of the materials which these elements are made of. It is in fact usual to constrain to each other the elements that realize up the probe cards by means of screws, which, in particular during a temperature testing, apply to the different supports a constraint that tends to cause a buckle thereto, with a consequent malfunctioning of the probe card in its whole, even at the limit of its failure to contact the contact pads of the device under test.

BRIEF SUMMARY

The probe card comprises a probe head equipped with a plurality of contact probes for connecting with a testing apparatus of electronic devices, in particular the ones integrated on wafers, having structural and functional features such as to allow overcoming the limitations and drawbacks which still nowadays affect the probe cards obtained through the known technologies, in particular allowing to ensure a correct planarity of the assembly of the different components of the card.

According to an aspect of the disclosure the special connecting elements realize an engagement in correspondence of components of the card that can be obtained with the fine pitch technology, as well as a suitable abutment able to ensure a correct retention of all of the components of the card itself.

The probe card for a testing apparatus of electronic devices comprises at least one probe head housing a plurality of contact probes, each contact probe having at least one contact tip adapted to abut onto a contact pad of a device under test, as well as a main support and an intermediate support, connected to the main support and adapted to realize a spatial transformation of distances between contact pads on its opposite faces as a space transformer, characterized in that it comprises at least one connecting element adapted to link the space transformer and the main support, this connecting element having a substantially rod-like body and being equipped with a first end portion comprising at least one terminal section adapted to be engaged in a corresponding housing realized in the space transformer and with a second terminal portion adapted to abut onto an abutment element linked to the main support.

More particularly, the disclosure comprises the following additional and optional features, taken singularly or in combination if needed.

According to another aspect of the disclosure, the abutment element may rest or be glued on the main support and may be made of a material having stiffness and planarity greater than a material which the main support is made of.

In particular, this abutment element can be made of a metal material, preferably a nickel-iron alloy.

According to another aspect of the disclosure, the second end portion of the at least one connecting element may have a maximum transverse dimension greater than a maximum transverse dimension of the body of the at least one connecting element and may define at least one undercut section adapted to abut onto the abutment element.

Still according to another aspect of the disclosure, the probe card may further comprise at least one frame equipped with at least one housing hole for the at least one connecting element and arranged between the main support and the space transformer.

Furthermore, the probe card may comprise an electric connection interface arranged between the space transformer and the main support in correspondence with this frame and adapted to realize a link between corresponding pluralities of pads realized on the space transformer and on the main support, in correspondence with their sides facing one another in correspondence with the frame.

In this case, the electric connection interface may comprise a plurality of clips, conductive sponges or microprobes able to connect corresponding pairs of the pads realized on the space transformer and on the main support, respectively.

According to another aspect of the disclosure, the first end portion of the at least one connecting element may have a maximum transverse dimension lesser than a maximum transverse dimension of the body and may realize at least one additional undercut section adapted to abut onto the frame.

More particularly, this frame may be realized by a metal sheet.

According to a further aspect of the disclosure, the abutment element may comprise a plurality of feet which are adjustable in a direction orthogonal to a plane defined by the abutment element.

Furthermore, the probe card may comprise a plurality of connecting elements, each of them being housed in a corresponding housing realized in the space transformer.

According to another aspect of the disclosure, the space transformer may comprise at least one multilayer, preferably an MLO organic multilayer, linked to a support, preferably ceramic, this housing being at least partially realized in the multilayer.

Furthermore, the space transformer may comprise a plurality of multilayer modules, each of them being equipped with at least one connecting element and being individually adjustable.

In particular, these multilayer modules may be linked to a common support.

Furthermore, the abutment element may comprise a plurality of modular abutment elements, each of them being linked to one of the multilayer modules through at least one connecting element.

In this case, the probe card may comprise connecting means which are common to more than one of the multilayer modules and which have a second end portion overlapping more than one of the modular abutment elements.

According to another aspect of the disclosure, the main support may comprise at least one housing which does not engage with the at least one connecting element.

Finally, still according to another aspect of the disclosure, the terminal section of the first end portion of the at least one connecting element may be threaded and adapted to be engaged with housings in the form of threaded holes.

The characteristics and advantages of the probe card according to the disclosure will be apparent from the description, made hereafter, of an embodiment thereof, given by way of an indicative and non-limiting example, with reference to the accompanying drawings.

BRIEF DESCRIPTION OF THE SEVERAL VIEWS OF THE DRAWINGS

FIGS. 3A-3D show schematic plan views from below of alternative configurations of the probe card of FIG. 2A;

FIG. 5 shows a schematic plan view from above of the probe card of FIG. 4.

DETAILED DESCRIPTION

Figure 1:
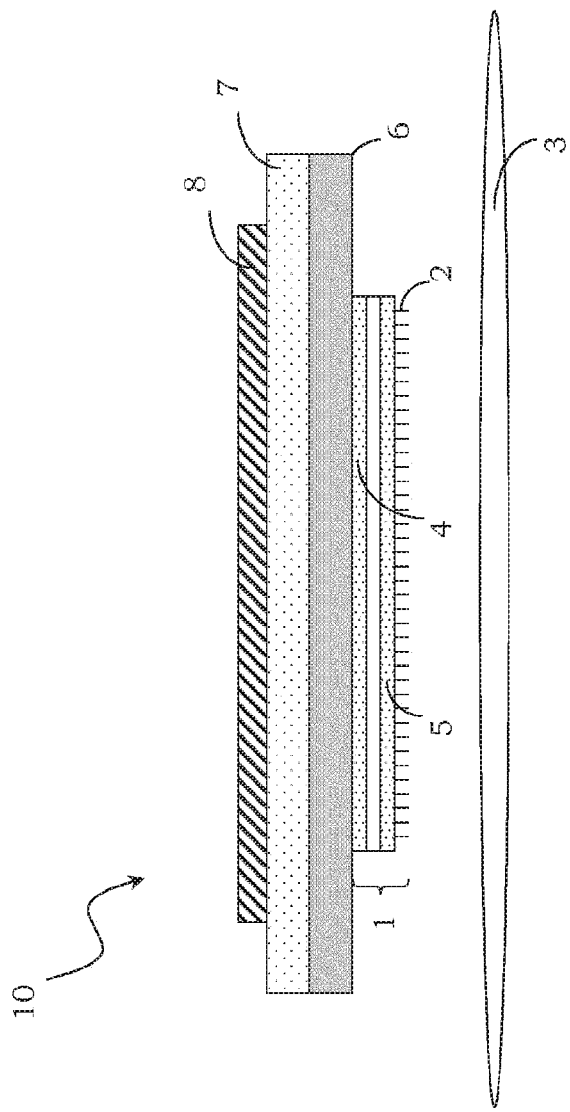
FIG. 1 shows a schematic sectional view of a probe card adapted to support a vertical probe head made according to the prior art.
Figure 2A:
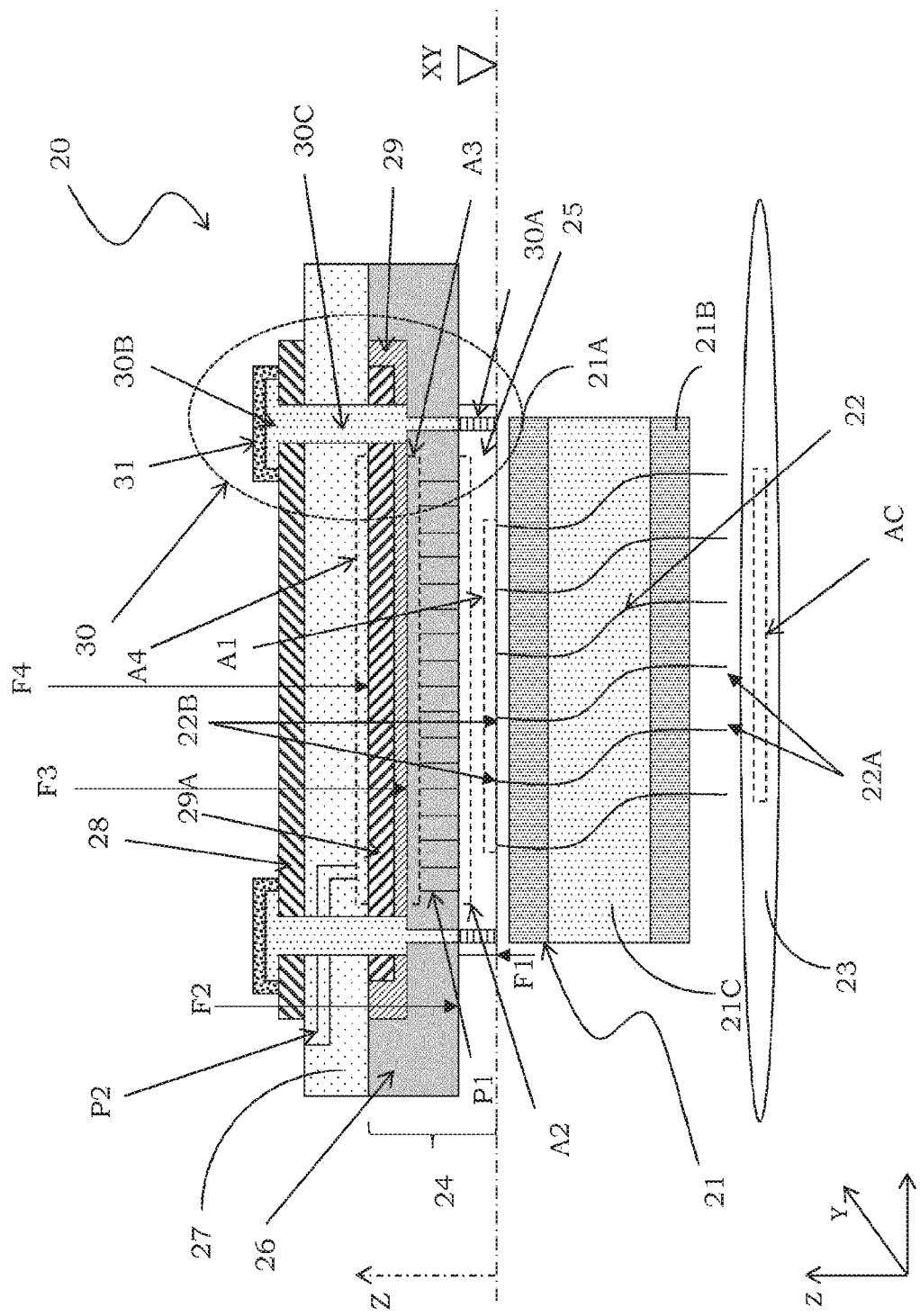
FIG. 2A shows a schematic sectional view of a probe card according to an embodiment of the disclosure.

With reference to said figures, and in particular to FIG. 2A, reference number 20 globally and schematically indicates a probe card comprising at least one probe head equipped with a plurality of contact probes for testing electronic devices, in particular integrated on a wafer.

It is worth noticing that the figures represent schematic views and are not drawn to scale, but instead they are drawn so as to enhance the important features of the disclosure.

Furthermore, the different aspects of the disclosure shown by way of examples in the figures can obviously be combined with each other and are interchangeable from one embodiment to another.

In particular, as shown in FIG. 2A, the probe card 20 comprises a probe head 21 housing a plurality of contact probes 22. In the example shown in the figure, the probe head 21 is of the vertical type and comprises at least one upper support or guide 21A and one lower support or guide 21B, having corresponding holes within which the contact probes 22 slide. The probe head 21 also comprises a containment element 21C for the probes, which is arranged between the upper and lower guides 21A and 21B.

Each of the contact probes 22 comprises in particular at least one first end or contact tip 22A adapted to abut onto a corresponding contact pad 23' of a device under test 23, this contact pad being in particular comprised in a pad area AC of the device under test 23; in this way the desired contact, in particular an electric contact, between the contact probes 22 and the pads 23' of the device under test 23, is established.

Each contact probe 22 further comprises a second end or contact tip 22B adapted to abut, analogously to the contact tip 22A, onto a corresponding contact pad 24' realized on an intermediate support, which is adapted to realize a spatial transformation and for this reason it is indicated as a space transformer 24. In particular, on a side F1 of the space transformer 24 a first pad area A1 having size and arrangement substantially analogous to the pad area AC of the device under test 23, is identified. In particular, the side F1 of the space transformer 24 faces the probe head 21, so that the pads 24' of the first pad area A1 of the space transformer 24 can be contacted by the contact probes 22 of the probe head 21.

By way of example, in the example shown in FIG. 2A, the space transformer 24 comprises a multilayer 25, in particular an organic multilayer or MLO, linked to a support 26, in particular a ceramic one. More particularly, the multilayer 25 realizes the real spatial transformation and has a first side corresponding to the side F and comprising the first pad area A1, as well as a second and opposite side F2, in particular resting on the support 26, and comprising a second pad area A2, which in turn includes a plurality of pads 25' in a number corresponding to the pads 24' of the first pad area A1, but arranged so as to have values of the distances between the corresponding centers, namely pitch values greater than the pitch values of the first pad area A1, the plurality of pads 25' of the second pad area A2 being suitably connected to the plurality of pads 24' of the first pad area A1.

In fact, the aim of the spatial transformation realized by the space transformer 24, and in particular by its multilayer 25, is to be able to relax the distance constraints between pads in view of the connection with the testing apparatus (not shown).

Furthermore, the support 26 comprises a third pad area A3 realized on a side F3 thereof, which is opposite the side resting on the second side F2 of the multilayer 25.

Inside the support 26 suitable electric connections P1 are provided to achieve the routing between the plurality of pads 25' of the second pad area A2 and the plurality of pads 26' of the third pad area A3; in this way the connection is ensured between the plurality of pads 24' of the first pad area A1 arranged on the side of the space transformer 24, in particular of its multilayer 25, facing the probe head, with the plurality of pads 26' of the third pad area A3 arranged on the opposite side of the space transformer 24, in particular of its support 26, resting on a further support, in particular a main connection support with the testing apparatus, wholly indicated with 27 and also known in the field as main PCB since it is usually produced precisely through the printed circuit technologies or PCB technology. The main support 27 is in particular adapted to connect with the testing apparatus, in a manner known to the skilled person, comprising, to this end, a plurality of pads 27' arranged on a side thereof, which is opposite the side resting on the space transformer 24, and suitably connected by means of further electric connections P2 to the plurality of pads 26' of the third pad area A3 and thus to the plurality of pads of the first pad area A1 in contact with the contact probes 22 of the probe head 21.

It is also pointed out that it is also possible to use a probe head of the micromechanical type as the so-called cantilever microprobes, with probes directly welded to the space transformer 24, the disclosure not being limited to a particular type of probe head as the vertical probe type illustrated in FIG. 2A.

Advantageously according to the disclosure, the probe card 20 further comprises suitable connecting elements 30 able to link the different components of the card itself, and in particular the space transformer 24 and the main support 27, which are equipped, to this end, with corresponding housings, as well as an abutment element 28, made of a material having a stiffness and planarity greater than a material which the main support 27 is made of.

More particularly, the abutment element 28 is realized by a support or metal plug. In fact, the normal metal working technologies allow producing supports or metal plugs having a high planarity, anyway in particular greater than the planarity that can be obtained through the PCB technologies through which the main support 27 is produced.

Such metallic abutment element 28 is preferably made of a nickel-iron alloy, for instance a stainless steel, in particular having a high nickel content, or alloys known as 42, Nilo® 42, ivar 42 or NiFe 42 alloys, just to name a few.

Figure 2B:
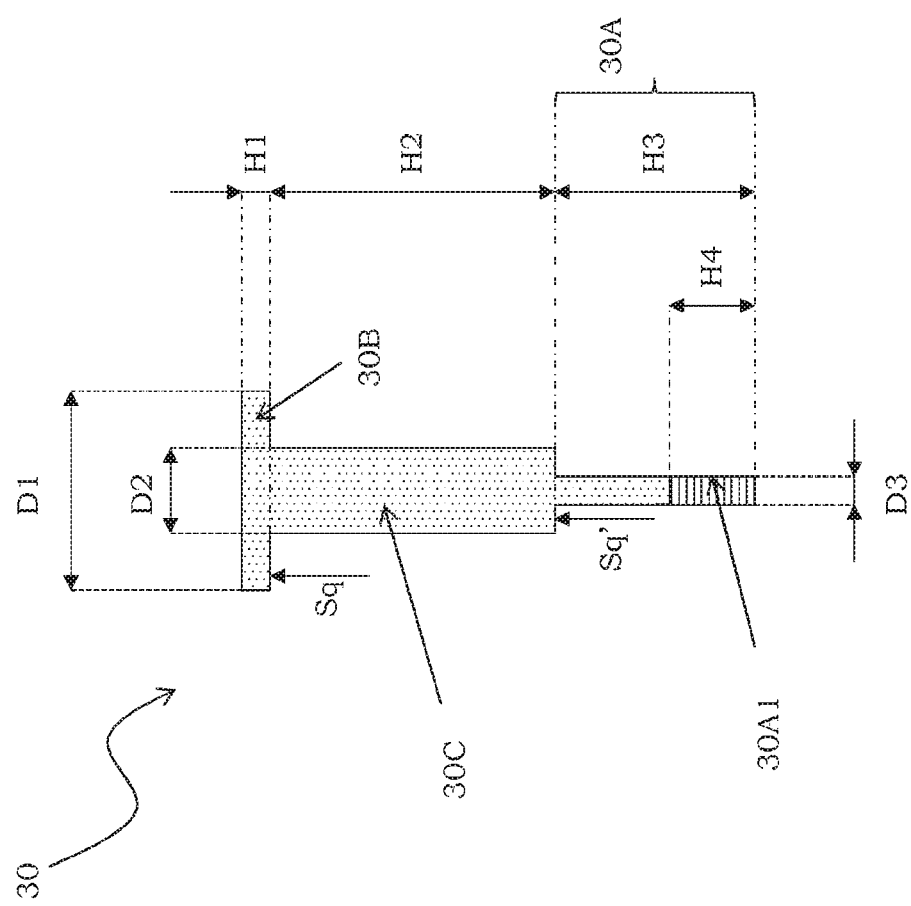
FIG. 2B shows a schematic sectional view in enlarged scale of a detail of the probe card of FIG. 2A.

Suitably, as schematically illustrated in FIG. 2B, each connecting element 30 comprises a first end portion, or tip portion 30A, and a second end portion, or head portion 30B, connected to a substantially rod-like body 30C, preferably having a circular or rectangular section.

More particularly, the head portion 30B has a maximum transverse dimension, indicated as diameter D1 also for elements not having a circular section, which is greater than the diameter D2 of the body 30C, so as to define at least one undercut section Sq adapted to abut onto the abutment element 28. The head portion 30B also has a height H1 comprised between 0.5 mm and 3 mm, whereas the body 30C has a height H2 comprised between 10 mm and 30 mm.

Furthermore, the tip portion 30A, having a height H3 comprised between 5 mm and 10 mm, comprises at least one terminal section 30A1 adapted to be engaged in a corresponding housing realized in the space transformer 24, for instance in its multilayer 25. Such terminal section 30A1 in particular has a height H4 comprised between 3 mm and 7 mm, preferably lesser than a thickness of the multilayer 25.

It is also possible to realize connecting elements 30 having tip portions 30A only partially extending in the multilayer 25, the terminal section 30A1 engaging in the space transformer 24 being able in this case to be realized also at least partially in correspondence with the support 26, which is in turn equipped with suitable housings for this terminal section 30A1.

In a preferred embodiment, the terminal section 30A1 is suitably threaded and is adapted to be engaged, in particular by screwing, in housings in the form of threaded holes realized in the space transformer 24 and possibly in further housings in the form of at least partially threaded holes realized in the support 26.

The clamping obtained thanks to the engagement of the connecting elements 30 of the terminal section 30A1 of their tip portion 30A in the space transformer 24, in particular in its multilayer 25 and the abutment of their head portion 30B, in particular with their undercut section Sq, onto the abutment element 28 ensures the correct link of the main support 27 with the space transformer 24, thus improving the planarity of the probe card 20 in its whole and making it sufficiently stiff to ensure a correct contact of the contact probes during the testing of electronic devices.

In order to improve a correct positioning, it is also possible to glue the abutment element 28 on the main support 27, though it is pointed out that its retainment is already performed by the connecting elements 30 and in particular by the undercut sections Sq of their head portions 30B.

It is also pointed out that the realization of the housings in the space transformer 24 allows ensuring high levels of precision and therefore of positioning of the connecting elements 30, in particular of their tip portions 30A, which are equipped with terminal sections 30A1, adapted to be housed and in particular to be engaged in correspondence with these housings, the space transformer 24 being a component of the probe card 20 achievable through a technology having greater precision than the technology producing the main support 27, in particular a fine pitch technology, and therefore ensuring a precise positioning of the housings therein realized and thus of the connecting elements 30 therein engaged. The positioning precision of the housings and therefore of the connecting elements 30 is further improved in case the space transformer 24 comprises the multilayer 25 wherein these housings are realized.

It is also possible to equip the space transformer 24 with suitable align elements, which help realizing the housings in precisely determined positions.

It is also pointed out that further housings, realized in the main support 27 and possibly in the support 26, adapted to house the connecting elements 30 without engagement, in particular the non-threaded holes, on the contrary do not need a particular precision, the correct working of these connecting elements 30 being ensured by the abutment of their head portions 30B onto the abutment element 28.

Substantially, the use of the connecting elements 30 having at least one terminal section adapted to be engaged in housings, for instance in the form of threaded holes, realized in a high-precision portion of the probe card 20, in particular the space transformer 24 and more particularly its multilayer 25, ensures a correct positioning of the space transformer 24 with respect to the probe head 21 in a plane XY defined by the main support 27 (indicated in section in FIG. 2A), in particular ensuring the correct positioning of the plurality of pads of the first pad area A1 with respect to the probe head 21 and therefore to the contact heads 22B of its contact probes 22. Analogously, the clamping of these connecting elements 30 in correspondence with their tip portions 30A and in particular with their terminal sections 30A1 in the housings realized in the space transformer 24 and in particular in its multilayer 25 and the abutment of their head portions 30B onto the abutment element 28 ensure a correct positioning of the space transformer 24 in a direction Z orthogonal to the plane XY, besides ensuring the various components of the probe card 20 to be retained.

In a preferred embodiment, the probe card 20 further comprises at least one frame 29 suitably equipped with a plurality of housing holes for the connecting elements 30 and arranged between the main support 27 and the space transformer 24, in particular its support 26. Such frame 29 suitably perforated actually realizes a reference in the plane XY for the positioning of these connecting elements 30.

In this case, the main support 27 comprises in turn a fourth pad area A4 realized on its side F4 facing the frame 29 and including a plurality of pads 27″ in connection with the plurality of pads 26′ of the third pad area A3 by a suitable electric connection interface 29A arranged between the main support 27 and the space transformer 24. More particularly, the electric connection interface 29A realizes a point-to-point connection between the plurality of pads 27″ of the fourth pad area A4 and the plurality of pads 26′ of the third pad area A3.

By way of example, it is possible to realize this electric connection interface 29A by means of a plurality of conductive pegs or sponges or by means of a plurality of microprobes, for instance of the pogo pin type, able to connect corresponding pairs of pads comprised in the third and fourth pad areas A3 and A4, respectively.

Furthermore, according to this preferred embodiment, the tip portion 30A of the connecting elements 30 is realized with a diameter D3 lesser than the diameter D2 of the body 30C, thus realizing further undercut sections Sq′ in correspondence with the frame 29.

This preferred embodiment of the probe card 20 according to the present disclosure further improves the positioning precision of the space transformer 24 in the plane XY, in particular thanks to the combination of the housings, for instance threaded holes therein realized, and of the housing holes realized in the frame 29 for housing the connecting elements 30. In particular, this frame 29 is preferably realized by means of a metal sheet, which allows a high precision in making the housing holes for the connecting elements 30 therein realized. Furthermore, the presence of the further undercut sections Sq′ of the body 30C in correspondence with the frame 29 improve the clamping of the components of the probe card 20 and ensure a correct positioning according to the direction Z of the space transformer 24 retained by these connecting elements 30.

It is furthermore possible to equip the abutment element 28 with suitable adjustable feet 31, in particular in the direction Z, orthogonal to a plane defined by the abutment element 28, realized in correspondence with the connecting elements 30.

Thanks to this adjustable feet 31, it is in particular possible to move in the direction Z the entire probe card 20, which is already made integral by the connecting elements 30 and thus as a single block, with respect to probe head 21.

The probe head 20 comprises in particular at least two connecting elements 30, as illustrated in FIG. 2A, so as to ensure a correct positioning in the plane XY and the clamping of its components.

It is possible to arrange these connecting elements 30 in correspondence with vertices of the space transformer 24, in particular of its multilayer 25, preferably of square or rectangular shape, possibly with rounded edges, as illustrated for instance in FIG. 3A.

It is also possible to arrange these connecting elements 30 in correspondence with the sides of the space transformer 24, in particular of its multilayer 25, preferably of square or rectangular shape, for instance in a substantially central position of these sides, as illustrated for instance in FIG. 3B.

In a preferred embodiment, the probe card 20 comprises four connecting elements 30 positioned in correspondence with the vertices of the space transformer 24, in particular of its multilayer 25, as schematically illustrated in FIG. 3C, or in correspondence with its sides, in particular in a substantially central position, as schematically illustrated in FIG. 3D.

Anyway the possibility is evident to use any number of connecting elements 30 positioned in any way on the space transformer 24 and in particular on its multilayer 25, obviously in a manner so as not to interfere with the positioning of the plurality of pads of the first pad area A1 and also of the corresponding second, third and fourth pad areas, A2, A3 and A4 defined on space transformer 24 and main support 27, these connecting elements 30 passing through and being housed in holes realized in the space transformer 24, in particular in its multilayer 25 and in its support 26, but also in the main support 27.

Thanks to the positioning precision obtained through the connecting elements 30, it is also possible to realize the space transformer 24 by means of a plurality of modular elements, each equipped with corresponding connecting elements 30 for the positioning in XYZ.

Figure 4:
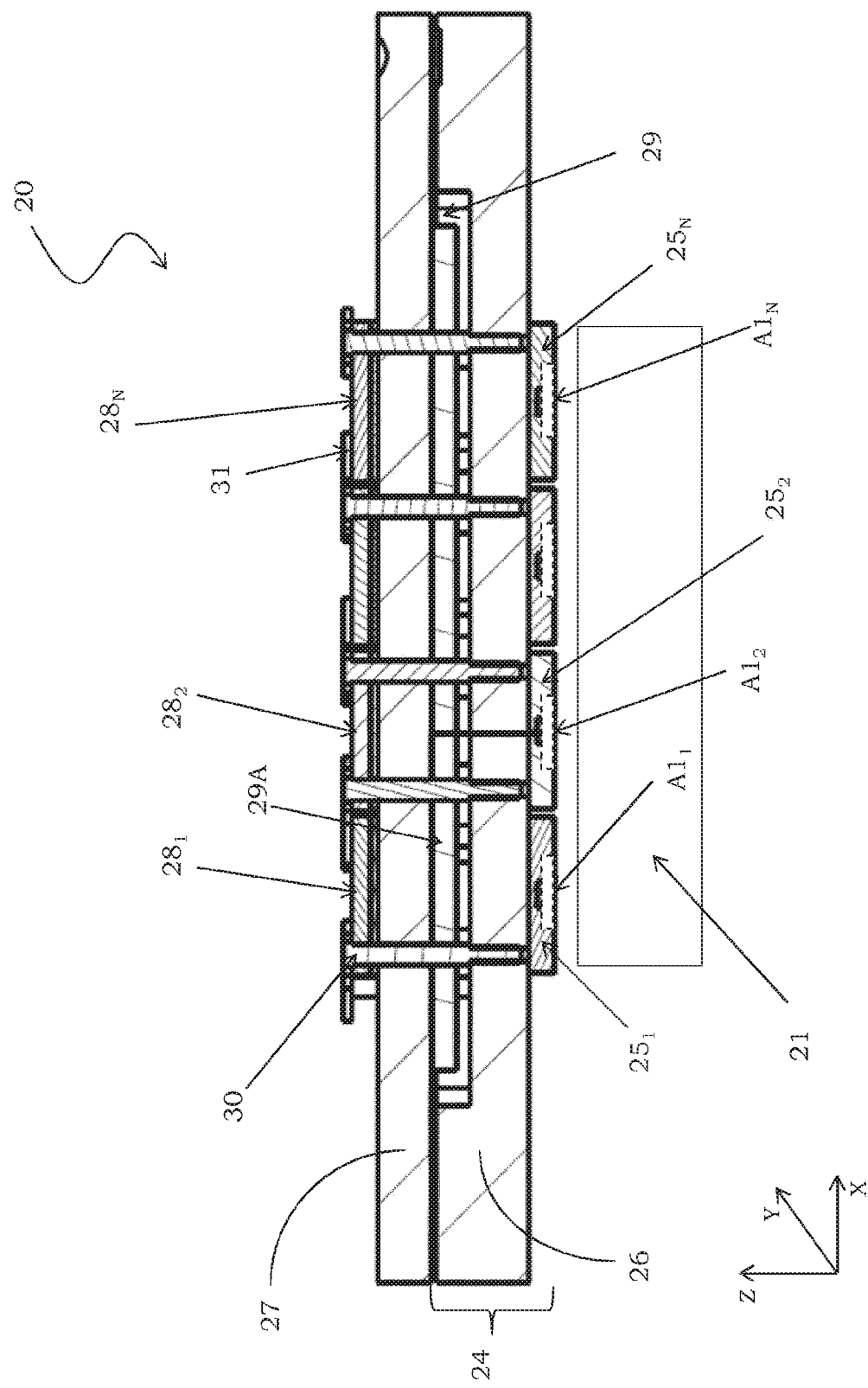
FIG. 4 shows a schematic sectional view of an alternative embodiment of the probe card according to the disclosure.

More particularly, as schematically illustrated in FIG. 4, where a space transformer 24 realized through an MLO technology is shown, the space transformer 24 comprises a plurality of multilayer modules $25_1 \ldots 25_N$ comprising corresponding pad areas $A1_1 \ldots A1_N$ and linked to a common support 26. Each multilayer module $25_1 \ldots 25_N$ is also equipped with corresponding connecting elements 30 able to position them individually and precisely in XYZ.

As previously, each connecting element 30 has a tip portion 30A equipped with a terminal section adapted to be engaged in housings realized in a corresponding multilayer module $25_1 \ldots 25_N$ and with a head portion 30B abutting onto an abutment element, for instance a common abutment element 28 linked to the main support 27, as explained in connection with FIG. 2A. In this case as well, each connecting element 30 may comprise a threaded terminal section and the housings realized in a corresponding multilayer module $25_1 \ldots 25_N$ may be in form of threaded holes.

It is pointed out that, according to this embodiment, it is possible to obtain a highly precise positioning of the space transformer 24, each multilayer module $25_1 \ldots 25_N$ being individually adjustable. In this way it is possible to realize space transformers with an even high surface area.

Preferably, as schematically illustrated in FIG. 5, the abutment element 28 as well comprises a plurality of modular abutment elements $28_1 \ldots 28_N$, each being linked to one of the multilayer modules $25_1 \ldots 25_N$ by means of the connecting elements 30.

In particular, the connecting elements 30 may be suitably realized in correspondence with vertices of the modular abutment elements $28_1 \ldots 28_N$, the head portions 30B being preferably realized with sizes, in particular with a diameter D1 adapted to overlap more than one modular abutment element $28_1 \ldots 28_N$. Analogously, it is possible to realize these connecting elements 30 in correspondence with sides of modular abutment elements $28_1 \ldots 28_N$, which are side by side to each other, the head portions 30B overlapping anyway more than one modular abutment element $28_1 \ldots 28_N$.

The connecting elements 30 so realized are therefore able to link at least one pair of modular abutment elements $28_1 \ldots 28_N$ to the main support 27, thanks to their head portions 30B overlapped to this pair of modular abutment elements $28_1 \ldots 28_N$.

In this way it is possible to reduce the number of connecting elements 30 used, some of them being common with more than one of the multilayer modules $25_1 \ldots 25_N$ and more than one of the modular abutment elements $28_1 \ldots 28_N$.

It is also possible to realize these multilayer modules $25_1 \ldots 25_N$ by overlapping, in particular gluing, one multilayer portion, such as for instance an MLO, and one support portion, for instance of the ceramic type, all of the support portions of the single multilayer modules $25_1 \ldots 25_N$ being thus linked to the common support 26.

In this case as well, the connecting elements 30 are equipped with tip portions 30A having at least one terminal section 30A1 adapted to be engaged in a corresponding housing and which can extend along the entire thickness of the multilayer modules $25_1 \ldots 25_N$ or of their multilayer portion or even in their support portion and only partially in the multilayer portion.

In conclusion, advantageously according to the disclosure, a high-planarity probe is obtained thanks to the presence of the connecting elements and of the abutment element adapted to link the components of the probe card itself, in particular the main support and the space transformer.

In particular, these connecting elements allow a correct positioning of the space transformer in XYZ and thus ensure the correct contact thereon, in particular on the plurality of pads realized thereon, of the contact probes of the probe head comprised in the probe card during the testing of electronic devices integrated on wafers.

Suitably, the probe card may also be equipped with a frame able to realize a reference for a more precise positioning of the connecting elements and therefore of the space transformer, in particular in XY. Such connecting elements can furthermore be realized so as to define undercut sections able to abut onto the frame and thus to ensure a more precise positioning thereof in Z and thus of the space transformer.

Furthermore, the probe card according to the disclosure has the possibility to further locally adjust the planarity of the space transformer realized by means of a plurality of multilayer modules that are individually adjustable.

This adjustment possibility allows further releasing the constraints linked to the manufacture of the space transformer.

Finally, it is pointed out that the probe card is also suitable for applications in which it is necessary to test large wafers and devices with a high number of pads.

From the foregoing it will be appreciated that, although specific embodiments of the disclosure have been described herein for purposes of illustration, various modifications may be made without deviating from the spirit and scope of the disclosure.

The various embodiments described above can be combined to provide further embodiments. These and other changes can be made to the embodiments in light of the above-detailed description. In general, in the following claims, the terms used should not be construed to limit the claims to the specific embodiments disclosed in the specification and the claims, but should be construed to include all possible embodiments along with the full scope of equivalents to which such claims are entitled. Accordingly, the claims are not limited by the disclosure.

The invention claimed is:

1. A probe card, comprising:
   a plurality of contact probes;
   a probe head housing the plurality of contact probes, each contact probe having at least one contact tip adapted to abut onto a contact pad of a device under test;
   a main support;
   a space transformer connected to the main support and adapted to realize a spatial transformation of distances between contact pads on opposite sides of the space transformer;
   a first connecting element that links the space transformer and the main support;
   a frame equipped with a housing hole that houses the connecting element, the frame being positioned between the main support and the space transformer; and
   an abutment element linked to the main support, wherein:
   the connecting element has a substantially rod-like body, a first end portion, and a second end portion,
   the space transformer has a first housing,
   the first end portion includes a terminal section engaged in the first housing of the space transformer,
   the second end portion abuts onto the abutment element linked to the main support, and
   the first end portion of the first connecting element has an maximum transverse dimension less than a maximum transverse dimension of the body and realizes an additional undercut section adapted to abut onto the frame.

2. The probe card of claim 1, wherein the abutment element rests on the main support.

3. The probe card of claim 1, wherein the abutment element is glued to the main support.

4. The probe card of claim 1, wherein the abutment element is realized by a material having a stiffness and a planarity greater than a material of which the main support is made.

5. The probe card of claim 1, wherein the second end portion of the connecting element has a maximum transverse dimension greater than a maximum transverse dimension of the body of the connecting element and defines an undercut section that abuts onto the abutment element.

6. The probe card of claim 1, further comprising an electrical connection interface positioned between the space transformer and the main support, in correspondence with the frame, the electrical connection interface providing a link between a first plurality of pads realized on a side of the space transformer and a second plurality of pads on a side of the main support that faces the side of the space transformer.

7. The probe card of claim 1, wherein the abutment element comprises a plurality of feet adjustable in a direction orthogonal to a plane defined by the abutment element being plate-like.

8. The probe card of claim 1, comprising a second connecting element housed in a second housing of the space transformer.

9. The probe card of claim 1, wherein the space transformer comprises a support and a multilayer linked to the support, the first housing being realized at least partially in the multilayer.

10. The probe card of claim 1, wherein the space transformer comprises a ceramic support and an organic multilayer linked to the ceramic support, the housing being realized at least partially in the multilayer.

11. The probe card of claim 1, wherein the first connecting element is one of a plurality of connecting elements and the space transformer includes a plurality of multilayer modules, each being equipped with at least one of the connecting elements and being individually adjustable.

12. The probe card of claim 11, wherein the abutment element includes a plurality of modular abutment elements, each being linked to at least one of the multilayer modules through at least one of the connecting elements.

13. The probe card of claim 12, wherein the plurality of connecting elements includes connecting elements which are common to more than one of said multilayer modules and have an end portion overlapping more that one of the abutment elements.

14. The probe card of claim 1, wherein the terminal section of the first end portion of the first connecting element is threaded and engages with a threaded hole in the space transformer.

15. A probe card, comprising:
a probe head housing a plurality of contact probes having respective contact tips adapted to abut onto contact pads of a device under test,
a main support and a space transformer connected to one another by a first connecting element, the first connecting element having a rod-like body, a first end portion, and a second end portion, wherein the space transformer comprises a first housing that engages a terminal section of the first connecting element and the main support comprises a second housing to house without engagement the first connecting element;
a metal abutment element glued to the main support; and
a frame equipped with a housing hole that houses the first connecting element, the frame being positioned between the main support and the space transformer,
wherein the first end portion of the first connecting element has an maximum transverse dimension less than a maximum transverse dimension of the body and realizes an additional undercut section adapted to abut onto the frame, and the second end portion of the first connecting element has a maximum transverse dimension greater than a maximum transverse dimension of the body of the first connecting element and defines an undercut section that abuts onto the abutment element.

16. The probe card of claim 15, further comprising an electrical connection interface positioned between the space transformer and the main support, in correspondence with the frame, and the electrical connection interface providing a link between a first plurality of pads realized on a side of the space transformer and a second plurality of pads on a side of the main support that faces the side of the space transformer.

17. The probe card of claim 15, wherein the space transformer comprises a ceramic support and an organic multilayer linked to the ceramic support, the first housing being realized at least partially in the multilayer.

18. The probe card of claim 15, wherein the first connecting element is one of a plurality of connecting elements and the space transformer includes a plurality of multilayer modules, each being equipped with at least one of the connecting elements and being individually adjustable.

19. The probe card of claim 18, wherein the abutment element includes a plurality of modular abutment elements, each being linked to at least one of the multilayer modules through at least one of the connecting elements.

20. The probe card of claim 19, wherein the plurality of connecting elements includes connecting elements which are common to more than one of said multilayer modules and have an end portion overlapping more that one of the abutment elements.

21. The probe card of claim 15, wherein the terminal section of the first end portion of the first connecting element is threaded and engages with a threaded hole in the space transformer.

22. A probe card, comprising:
a probe head housing a plurality of contact probes having respective contact tips adapted to abut onto contact pads of a device under test;
a plurality of connection elements, including a first connection element;
a main support and a space transformer connected to one another by the first connecting element, the first connecting element having a rod-like body, a first end portion, and a second end portion, wherein the space transformer comprises a first housing that engages a terminal section of the first connecting element and the main support comprises a second housing to house without engagement the first connecting element;
a frame equipped with a housing hole that houses the first connecting element, the frame being positioned between the main support and the space transformer; and
a metal abutment element glued to the main support, wherein:
the first end portion of the first connecting element has an maximum transverse dimension less than a maximum transverse dimension of the body and realizes an undercut section adapted to abut onto the frame,
the second end portion of the first connecting element has a maximum transverse dimension greater than a maximum transverse dimension of the body of the first connecting element and defines an undercut section that abuts onto the abutment element,
the space transformer includes a plurality of multilayer modules, each being equipped with at least one of the connecting elements and being individually adjustable, and
the abutment element including a plurality of modular abutment elements, each being linked to at least one of the multilayer modules through at least one of the connecting elements.

23. The probe card of claim 22, wherein the plurality of connecting elements includes connecting elements which are common to more than one of said multilayer modules and have an end portion overlapping more that one of the abutment elements.

24. The probe card of claim 22, wherein the terminal section of the first end portion of the first connecting element is threaded and engages with a threaded hole in the space transformer.

25. The probe card of claim 22, wherein the space transformer comprises a ceramic support and an organic multilayer linked to the ceramic support, the first housing being realized at least partially in the multilayer.

26. A probe card, comprising:
   a probe head housing a plurality of contact probes having respective contact tips adapted to abut onto contact pads of a device under test;
   a main support and a space transformer connected to one another by a first connecting element, the first connecting element having a rod-like body, a first end portion, and a second end portion, wherein the space transformer comprises a first housing that engages a terminal section of the first connecting element and the main support comprises a second housing to house without engagement the first connecting element;
   a frame equipped with a housing hole that houses the first connecting element, the frame being positioned between the main support and the space transformer; and
   a metal abutment element that rests on the main support, wherein the first end portion of the first connecting element has an maximum transverse dimension less than a maximum transverse dimension of the body and realizes an undercut section adapted to abut onto the frame, and the second end portion of the first connecting element has a maximum transverse dimension greater than a maximum transverse dimension of the body of the first connecting element and defines a undercut section that abuts onto the abutment element.

* * * * *